(12) United States Patent
Shen

(10) Patent No.: US 9,397,035 B2
(45) Date of Patent: Jul. 19, 2016

(54) INTEGRATED INGOT FOR TSV SUBSTRATES AND METHOD FOR MAKING THE SAME

(71) Applicant: Yuci Shen, Cupertino, CA (US)

(72) Inventor: Yuci Shen, Cupertino, CA (US)

(*) Notice: Subject to any disclaimer, the term of this patent is extended or adjusted under 35 U.S.C. 154(b) by 154 days.

(21) Appl. No.: 14/085,721

(22) Filed: Nov. 20, 2013

(65) Prior Publication Data

US 2015/0140286 A1    May 21, 2015

(51) Int. Cl.
*H01L 29/40* (2006.01)
*H01L 23/52* (2006.01)
*H01L 21/44* (2006.01)
*H01L 23/498* (2006.01)
*H01L 21/48* (2006.01)

(52) U.S. Cl.
CPC ........ *H01L 23/49827* (2013.01); *H01L 21/486* (2013.01); *H01L 21/4842* (2013.01); *H01L 23/49838* (2013.01); *H01L 23/49866* (2013.01); *H01L 23/49894* (2013.01)

(58) Field of Classification Search
CPC ............ H01L 23/49827; H01L 21/486; H01L 23/49894
USPC .................................. 257/621, 773; 438/667
See application file for complete search history.

(56) References Cited

U.S. PATENT DOCUMENTS

| | | | |
|---|---|---|---|
| 7,781,235 B2* | 8/2010 | Luo et al. | 438/14 |
| 7,986,042 B2* | 7/2011 | Or-Bach et al. | 257/773 |
| 2013/0241025 A1* | 9/2013 | Pagani | 257/499 |

* cited by examiner

*Primary Examiner* — Luan C Thai

(57) ABSTRACT

The disclosure describes a metal-wire-based method for making an integrated ingot, which basically comprises a dielectric matrix and a patterned array of metal wires, and may further comprise other additive elements at desired locations. After sawing the integrated ingot into slices, a plurality of substrates containing through substrate metal pillars and other additive elements at desired locations are produced in a batch way. The metal-wire-based method comprises the key steps: forming a patterned array of metal wires, precisely integrating other additive elements at desired locations when needed, forming a solid dielectric material in the empty space among and around metal wires and other additive elements. Furthermore, a guidance metal wire method is described for precisely integrating other additive elements at desired locations in a patterned array of metal wires.

20 Claims, 12 Drawing Sheets

INTEGRATED INGOT FOR TSV SUBSTRATES AND METHOD FOR MAKING THE SAME

TECHNICAL FIELD OF THE INVENTION

The disclosure relates generally to 3-dimensional (3D) integrated circuit semiconductor packaging technology, and particularly to technologies for producing through silicon via (TSV), through substrate via (TSV) and through glass via (TSV) interposers, which are used in packaging semiconductor chips or electric devices.

BACKGROUND OF THE INVENTION

An interposer is a bridge connecting two or more electric devices with a fine pitch of electric contact pads to a substrate or board with a coarse pitch of electric contact pads. Through silicon via (TSV) is a vertical electrical connection completely through a silicon wafer or die. A silicon TSV interposer may connect multiple chips with fine pitch mounted on its top side to a substrate with a coarse pitch. A silicon TSV interposer may also connect chips mounted on its both sides. A silicon TSV interposer basically comprises a silicon substrate with TSVs and redistribution layers (RDL) and electric contact pads on its both sides. An organic TSV (though substrate via) interposer has the similar structure as a silicon TSV interposer, but use an organic substrate as base material. An organic TSV (though substrate via) interposer is much cheaper than a silicon TSV interposer. However, it is a big challenge to manufacture an organic TSV interposer with very fine features. For the application with fine features, a silicon TSV interposer is usually used. A silicon TSV interposer is usually manufactured by silicon wafer processing technology, while an organic TSV interposer may be manufactured by organic substrate or IC package assembly technologies. Recently, through glass via (TGV) glass interposers are being introduced and developed.

The methods of prior arts for making through silicon via (TSV), through organic substrate via (TSV) and through glass via (TSV) interposers are generally fall into two categories: one is substrate-based method (named herein), and the other is via-based method (named herein). The substrate-based method basically comprises: 1) opening a patterned array of vias on a substrate (a piece of silicon, organic substrate or glass), and 2) using a conductive material to fill in the patterned array of vias. And the via-based method basically comprises: 1) forming a patterned array of vias on a carrier, 2) using a substrate material to cover and seal the patterned array of vias. Through silicon via (TSV) interposers are based on the substrate-based method. And through organic substrate via (TSV) and through glass via (TGV) interposers may use both methods. Manufacturing interposers with through substrate vias is very time-consuming and expensive, especially for silicon interposers.

It is noticed in prior arts that the cross sectional structure of the traditional unidirectional fiber reinforced composites roughly has the similar structure as a TSV substrate. The unidirectional fiber reinforced composites are usually produced by using a matrix material to bond a bundle of unidirectional fiber together. It looks like a low cost method to produce TSV substrates by cutting a unidirectional metal wire reinforced composites into slices. However, a useful TSV substrate for packaging electronic devices cannot be simply produced in such a way. The basic reason is that through-substrate vias in a TSV substrate are precisely patterned, including 1) a feature of sawing streets (for dividing the vias into a plurality of via units for further cutting a TSV substrate into a plurality of TSV substrate units for packaging semiconductor chips and other electronic devices), 2) precisely defined via pitch from one to another, and 3) through-substrate vias may be depopulated wherein some vias are not formed in a regular via array. So, the traditional method using a matrix material to bond a bundle of fibers together cannot be directly used to produce a useful TSV substrate because the fibers are not precisely patterned. Furthermore, it is a challenge to integrate some other elements (such as capacitors, resistors or inductors) in an array of fibers and at desired locations. The present invention describes a method to overcome these issues so as to form a composite integrated with a precisely patterned array of metal wires wherein some other elements can also be added at desired locations. Such a composite is called an integrated ingot herein, which can be sawed into slices for further producing TSV substrates with other embedded elements at desired locations.

SUMMARY OF THE INVENTION

It is noted that TSV/TGV interposers are produced in a way of piece by piece according to the substrate-based or via-based methods in prior arts. A piece of interposer may singulated into a plurality of interposer units along the sawing streets in X and Y directions among these units. Each interposer unit can be used for a semiconductor package. For example, a silicon TSV interposer wafer with 300 mm diameter may be singulated into about 81 (9×9 array of units) TSV interposer units with a size of 30 mm by 30 mm. The present invention describes an integrated ingot for producing TSV substrates in a batch way and a method for making the same. The present method for making TSV substrates is a metal-wires-based method or 3D method (named herein). In contrast, the methods of prior arts are generally a 2D method.

In one preferred embodiment, a method for making an integrated ingot is described. The integrated ingot comprises a dielectric matrix, a patterned array of metal wires joined with other mechanical and/or electric components (called additive elements herein) and a layered structure in the metal wire direction. A plurality of substrates containing a patterned array of through substrate metal pillars and other additive elements at desired locations can be produced by sawing such an integrated ingot into slices. The method basically comprises the steps: forming a plurality of additive element strings; forming and fixing a patterned array of metal wires joined with additive element strings at desired locations; placing and positioning the patterned array of metal wires with additive element strings in a mold; adding a liquid or powder type of dielectric matrix material into the mold; solidifying the dielectric matrix material to form an integrated ingot; and further sawing the integrated ingot into slices to form a plurality of substrates containing a patterned array of through substrate metal pillars and other additive elements at desired locations.

An illustrative example of an integrated ingot according to the present method is schematically showed in FIG. 1. An integrated ingot can be sawed into a plurality of slices. For example, a 1 m long of integrated ingot may be sawed into 1000 pieces of substrates. For 30 mm×30 mm substrate units, an integrated ingot with 300 mm diameter may produce 1000×9×9=81000 substrate units. It is noted that the cross-sectional shape of an integrated ingot is not limited to the round shape showed in the example of FIG. 1. It may be designed according to requirements.

Because a great amount of metal wires and a great amount of discrete additive elements may be involved in the production of an integrated ingot, it is a challenge to precisely arrange and fix these great amount of metal wires and additive elements to form a patterned array of metal wires and additive elements at desired location. In one preferred embodiment of the present invention, a method for arranging and fixing metal wires and additive elements is described. The method is based on a set of flat strips and a technique using guidance metal wires to precisely align, pattern and fix a plurality of metal wires and discrete additive elements.

The first advantage of the present invention is that TSV substrates can be produced efficiently in a batch way. The second advantage is that other additive elements such as capacitors, resistors and inductors can be embedded in TSV substrates and precisely at desired locations. And more advantages of the present invention include that very small via diameter and very fine via pitch can be achieved by using very thin metal wires.

The key inventive concepts in the present invention is to use an arranging and fixing method basically comprising a set of flat metal strips and guidance metal wires to form a precisely patterned array of metal wires and to integrate other additive elements into the patterned array of metal wires, and to use the precisely patterned array of metal wires to form an integrated ingot. More features, advantages and inventive concepts of the present invention are described with reference to the detailed description of the embodiments of the present invention below.

BRIEF DESCRIPTION OF THE DRAWINGS

FIG. 1C and FIG. 1D are schematic top views of two more examples of one unit 100 included in the integrated ingot showed in FIG. 1, wherein FIG. 1C shows a metal wire unit 1300 with a depopulated array of metal wires, and FIG. 1D shows a piece of material 146 is integrated in a metal wire unit 1400.

DETAILED DESCRIPTION OF THE PREFERRED EMBODIMENT

Some terminologies used in the detailed descriptions are first explained herein for illustrative clarity. 1): A patterned array of metal wires means that the cross-sections of these metal wires form a patterned array. The difference between a patterned array of metal wires and an array of metal wires is that a patterned array may have more features in addition to an array which only include a regular arrangement in X and Y direction. An example of a patterned array of metal wires is an array of metal wires with the feature of sawing streets as showed in FIG. 1. The sawing streets separate an array of metal wires into a plurality of units in X and Y directions, and each unit contains an array of metal wires. Another example of a patterned array of metal wires is a depopulated array of metal wires wherein some metal wires are removed from the array of metal wires as showed in FIG. 1C. 2): An additive element means something else in contrast to metal wires, particularly means a passive electric device, including capacitor, resistor and inductor. 3): guidance metal wires means that they can introduce and position other additive elements at desired locations in an array or a patterned array of metal wires and. 4): a substrate means a piece of material, which may be a piece of silicon, a piece of glass or a piece of organic material. And a substrate unit is a portion of a substrate, which is produced by singulating a substrate into a plurality of substrate units.

Figure 1:
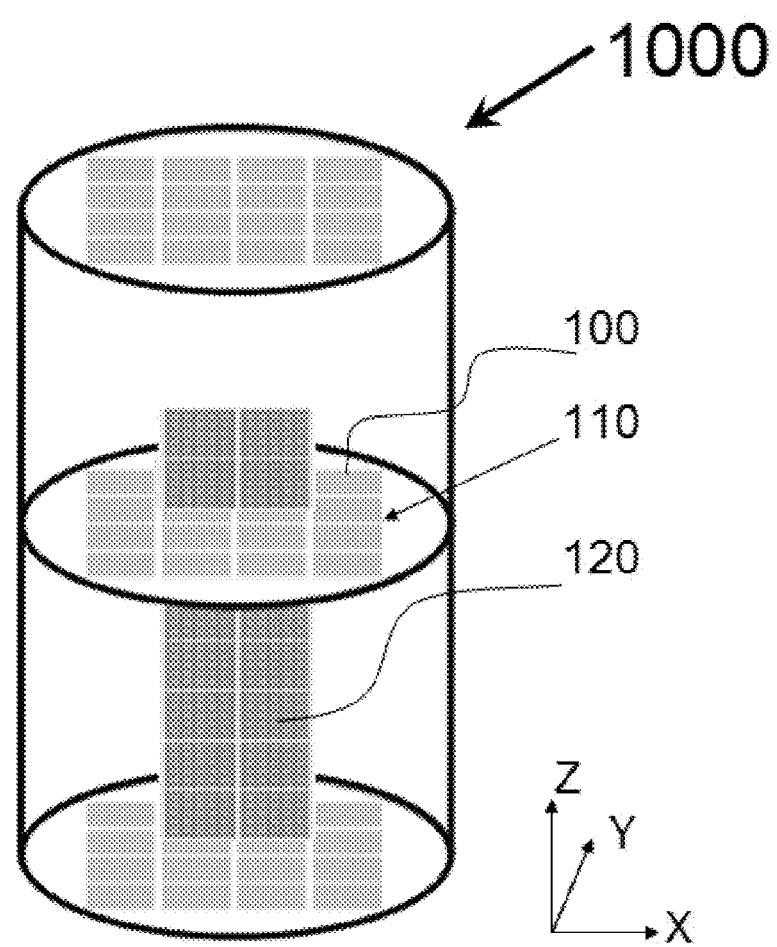
FIG. 1 is a schematic diagram of an integrated ingot 1000 having patterned structures in X-Y plane and along Z (or vertical) direction of one embodiment of the present invention.

FIG. 1 is a schematic diagram of an integrated ingot 1000 containing a patterned array of metal wires and additive element strings of one embodiment of the present invention, wherein the X-Y-Z coordinates show the directions in the integrated ingot for illustrative purpose. Geometrically, an integrated ingot of the present invention has at least a patterned array of metal wires unidirectional aligned in Z direction and patterned in X-Y plane, and may further have a layered structure in metal wire direction or Z direction. The layered structure is defined by additive elements if they are integrated in the ingot. In X-Y planes, a patterned array of metal wires is grouped into a plurality of patterned units 100 by sawing streets 110. A Z-direction cross-sectional plane 120 contains a layered structure in Z direction wherein additive elements are involved. The zoom-out views of examples of a patterned unit 100 and cross-sectional plane 120 are schematically showed in FIG. 1A and FIG. 1B. And FIG. 1C and FIG. 1D are two more examples of one unit 100, wherein FIG. 1C shows a substrate unit 1300 with a depopulated array of metal wires, and FIG. 1D shows a substrate unit 1400 with a piece of material 146 integrated in a patterned array of metal wires.

Figure 1A:
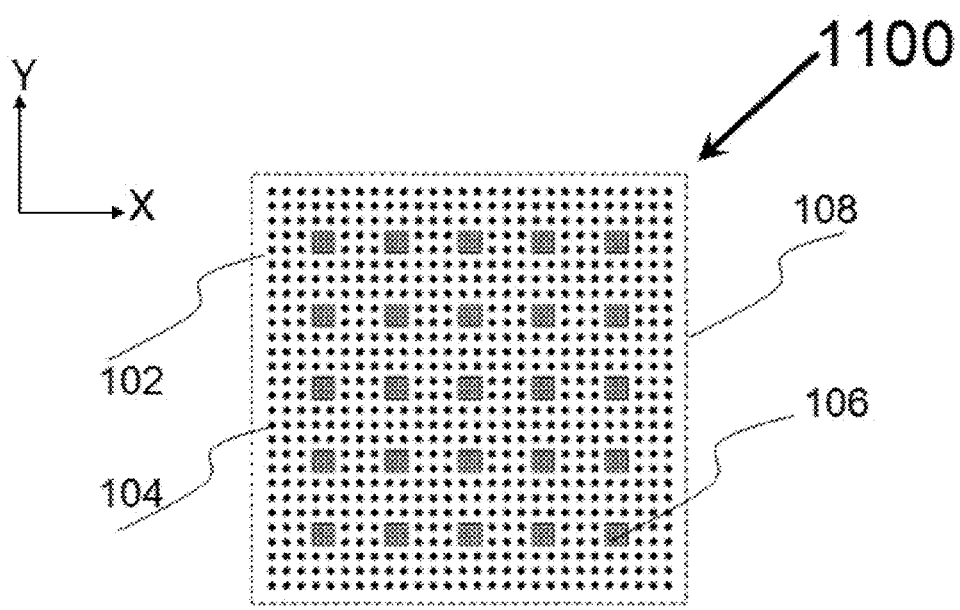
FIG. 1A is a schematic top view of an example of one unit 100 included in the integrated ingot showed in FIG. 1.

FIG. 1A is a schematic cross-sectional (X-Y plane) view of a substrate unit 1100 singulated from a slice of an integrated ingot 1000. The substrate unit 1100 contains a patterned array of metal wires and additive elements, which can be used for packaging IC dies or other electric devices. The numbers 102, 104, 106 and 108 in FIG. 1A designates matrix material, metal wires/pillars, additive elements, and edge of the substrate unit, separately. The patterned array of metal wires and additive elements is only for illustrative purpose, which may be customized according to the requirement in a specific application. For example, the wire pitches in X-direction and Y-direction may be different, the wire pitch in X-direction or Y-direction may vary if needed, and additive elements may be different from one location to another.

Figure 1B:
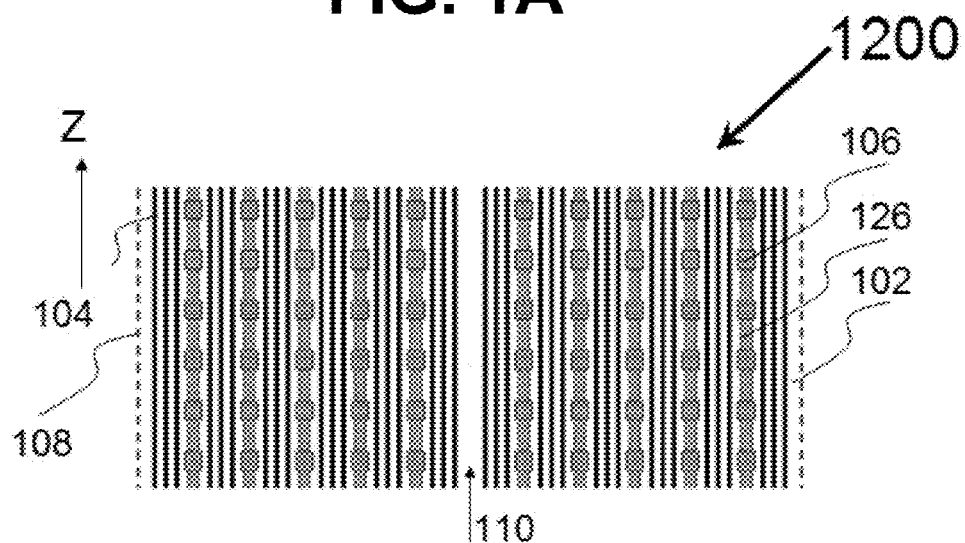
FIG. 1B is a schematic cross-sectional view of two units 120 included in the integrated ingot showed in FIG. 1, wherein the sawing streets 110 are illustrated.
Figure 1C:
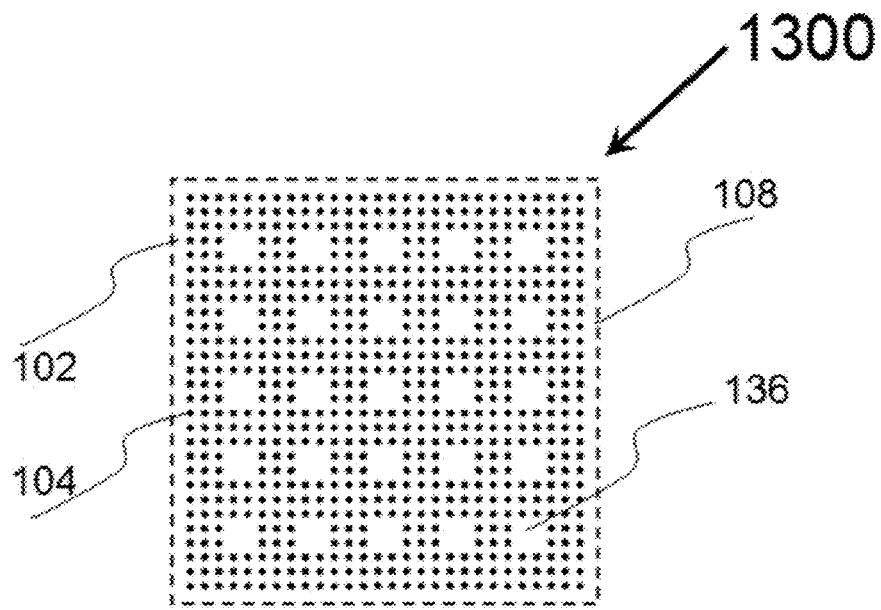
Figure 1D:
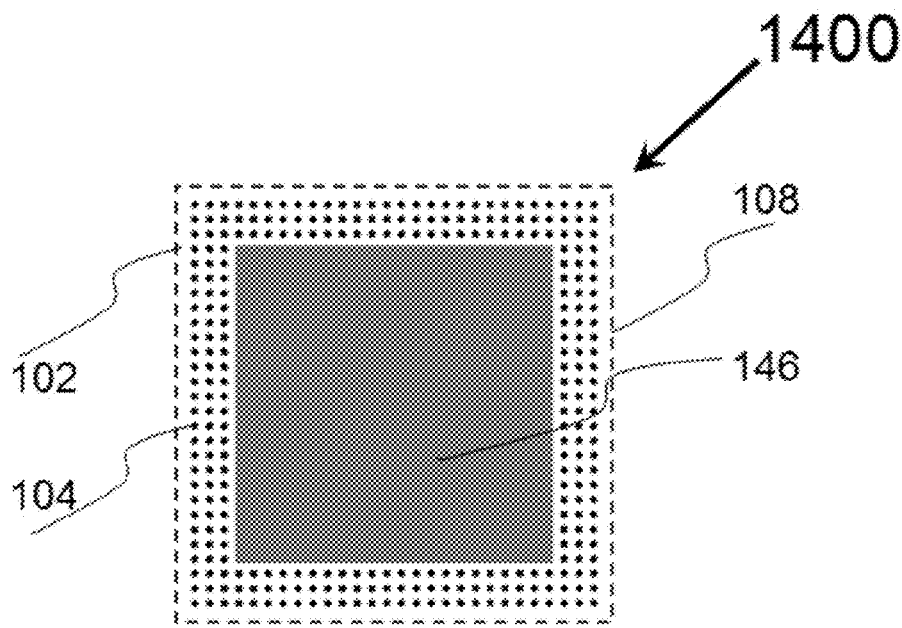

FIG. 1B is a schematic diagram of two patterned units 1200, wherein the same numbers 102, 104, 106 and 108 as used in FIG. 1A designate the same items, the number 110 designates sawing streets as also showed in FIG. 1, and the number 126 designates connection bodies for connecting a plurality of additive elements 106 as a additive element string which is further explained in the following FIG. 2. The additive elements form a layered structure in Z-direction. The number of additive elements in an additive element string determines the layer number and how many slices of TSV substrates can be produced from an integrated ingot. The small layer number in the figures of the present disclosure is only for illustrative purpose. In practice, the layer number may be very great. For example, if the useful length of an integrated ingot is 1 meter long and TSV substrates is about 0.8 mm to 1 mm thick, about 1000 slices of TSV substrates can be produced from such an integrated ingot. These raw TSV substrates need to be thinned and polished so as to form regular and flat surfaces on both sides ready for further processing.

Figure 2:
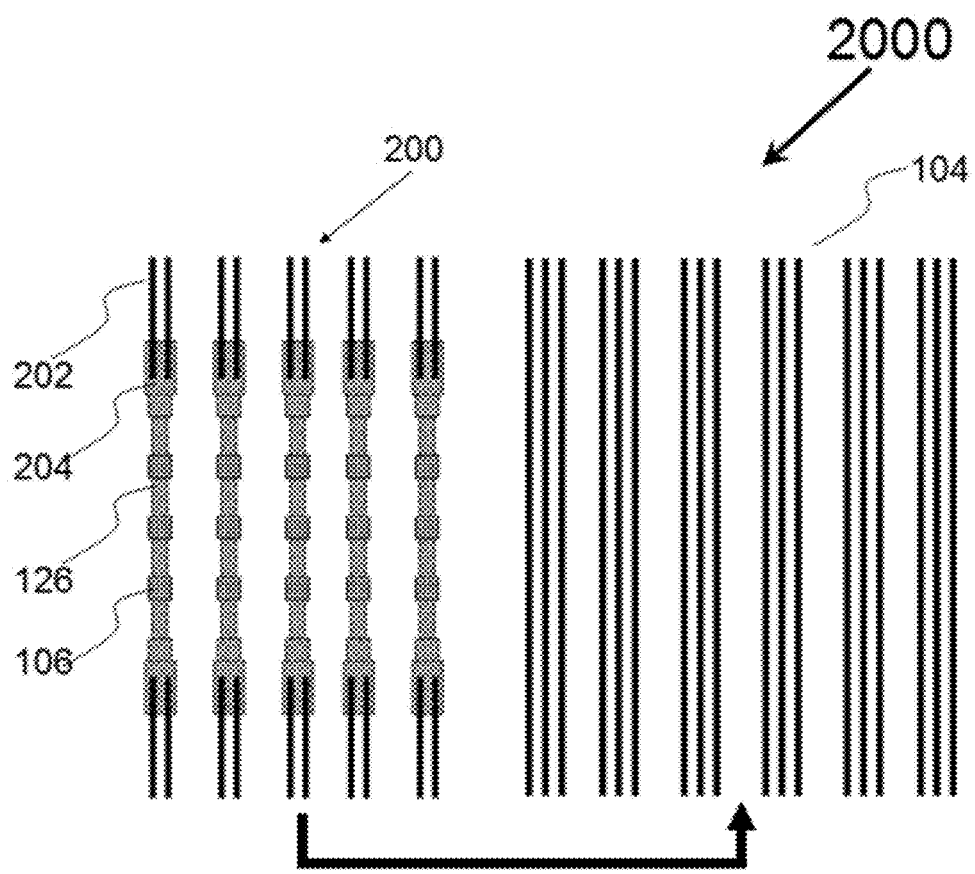
FIG. 2 is a schematic diagram of an array of metal wires 104 and a method for using guidance metal wires 202 to integrate a plurality of additive element strings 200 into the array of metal wires, wherein the guidance metal wires 202 and the discrete elements 106 are joined together by a connection material 126 of one embodiment of the present invention.
Figure 2A:
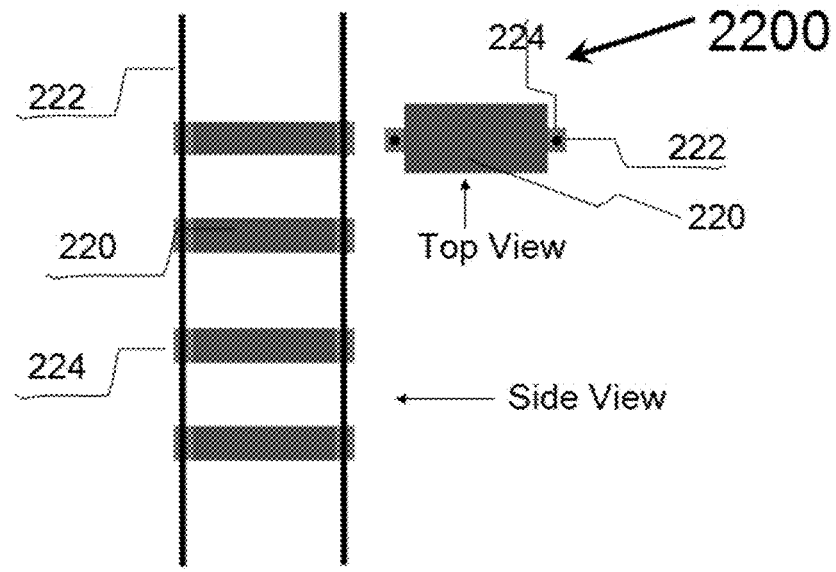
FIG. 2A is a schematic diagram for showing another method for forming an additive element string with guidance metal wires at its two ends.
Figure 2B:
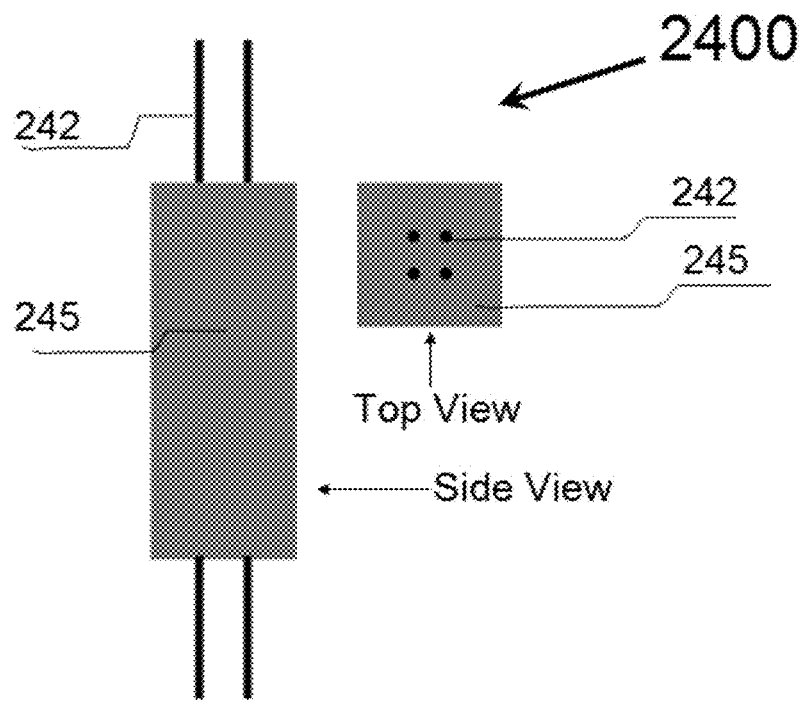
FIG. 2B is a schematic diagram for illustrating a column with guidance metal wires at its two ends.

FIG. 2 is a schematic diagram of additive element strings 200 and aligned metal wires 104. An additive element string 200 comprises a plurality of additive elements 106, connection bodies 106, connection ends 204 for embedding and fixing some guidance metal wires 202 at both ends. The guidance metal wires 202 at both ends of an additive element string 200 have metal wire pitches to match the metal wire pitches at desired locations in a patterned array of metal wires 104 so that they can introduce a plurality of additive element strings 200 into a metal wire pattern. FIG. 2A illustrates another way to form an additive element string with guidance metal wires at its ends, wherein additive elements 220 are bonded to metal wires 222 through bonding material 224. Both ends of the metal wires 222 are designed to match the pitches in a patterned array of metal wires wherein the additive element string joins. The bonding material 224 may be conductive so that the additive elements directly get electrical access to the outside. FIG. 2B illustrates guidance metal wires 242 installed on both ends of a material column 245, which can introduce the material column 245 into a patterned array of metal wires.

Figure 3:
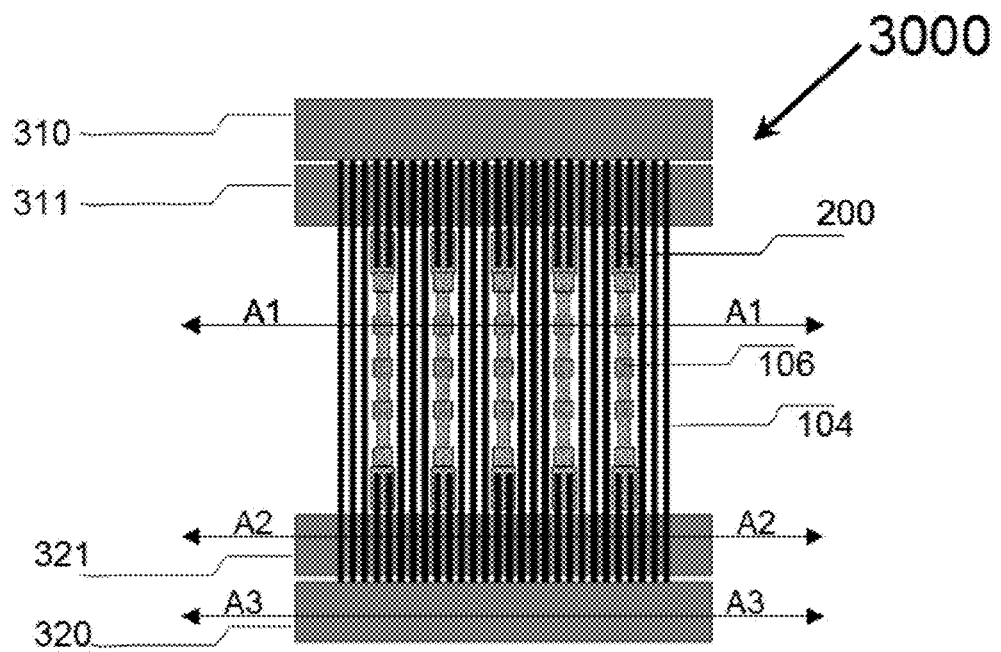
FIG. 3 is a schematic diagram of a method of using a set of flat metal strips to form and fix a patterned array of metal wires joined with additive element strings at desired location of one embodiment of the present invention.

FIG. 3 is a schematic diagram of an integrated assembly 3000 of a patterned array of metal wire and additive element strings which are arranged and fixed by an arranging and fixing assembly 310 and 311 at one end and another similar arranging and fixing assembly 320 and 321 at another end. The same numbers 104, 106 and 200 in FIG. 3 designate the same items as those in previous figures, and the lines of A1 to A1, A2 to A2, and A3 to A3 designate the cross-sectional planes for further illustrating an arranging and fixing assembly 320 and 321 in FIG. 3B and FIG. 3C. An arranging and fixing assembly basically includes an outer set of flat strips (310 or 320) and an inner set of flat strips (311 or 321). The outer set of flat strips defines the pitches among metal wires in one direction (X or Y direction) and the inner set of flat strips defines the pitches among metal wires in another direction (Y or X direction). In such a way, the pitches in X and Y directions are defined by a set of thin flat strips. A pair of inner and outer sets of flat strips (310 and 311, or 320 and 321) may further combine with some fixing and handling pieces to form a fixture by adding. In such a way, metal wires can be arranged as a patterned array and fixed at both ends for further processing. These additional fixing and handling pieces can be easily designed and not illustrated by using figures here.

Figure 3A:
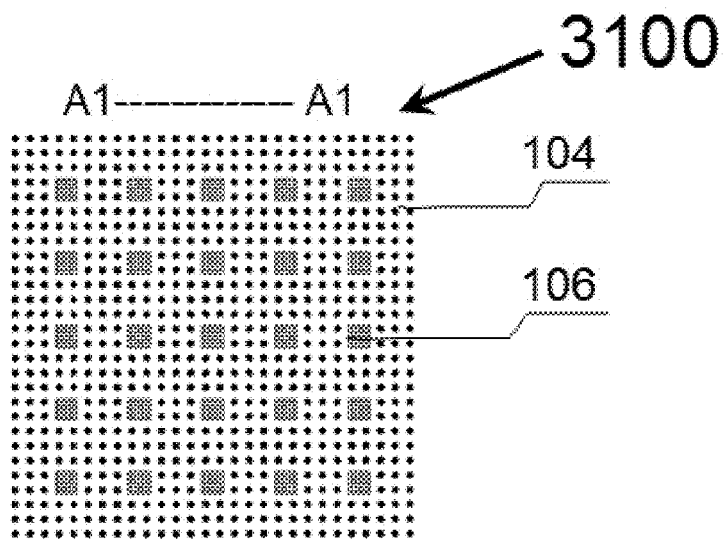
FIG. 3A is a schematic cross-sectional view along A1 to A1 plane in FIG. 3 for illustrating a patterned array of metal wires and additive elements.

The schematic diagram in FIG. 3 only includes one patterned unit in X-Y plane for illustrative clarity. In practice, the number of patterned units may be large. For example, a 300 mm diameter of integrated ingot may include about 9×9=81 patterned units with 30 mm×30 mm. Referring to FIG. 3A, a schematic cross-sectional (X-Y plane) view along A1 to A1 plane in FIG. 2 for illustrating a patterned array of metal wire and additive element strings 3100 which forms the substrate unit showed in FIG. 2.

Figure 3B:
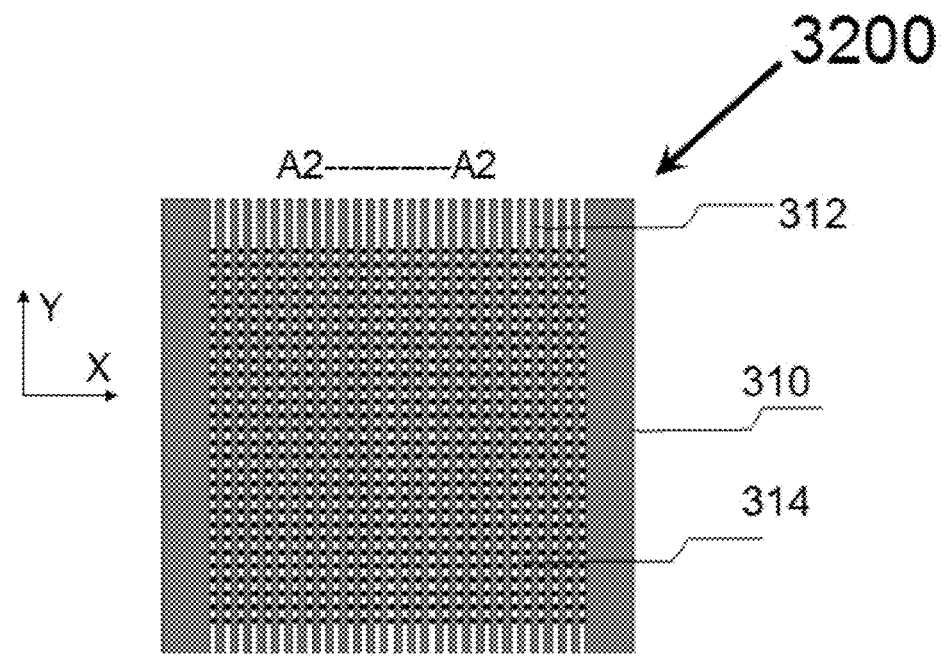
FIG. 3B is a schematic cross-sectional view along A2 to A2 plane in FIG. 3 for illustrating a set of flat strips for arranging a plurality of metal wires as an array in Y direction.
Figure 5:
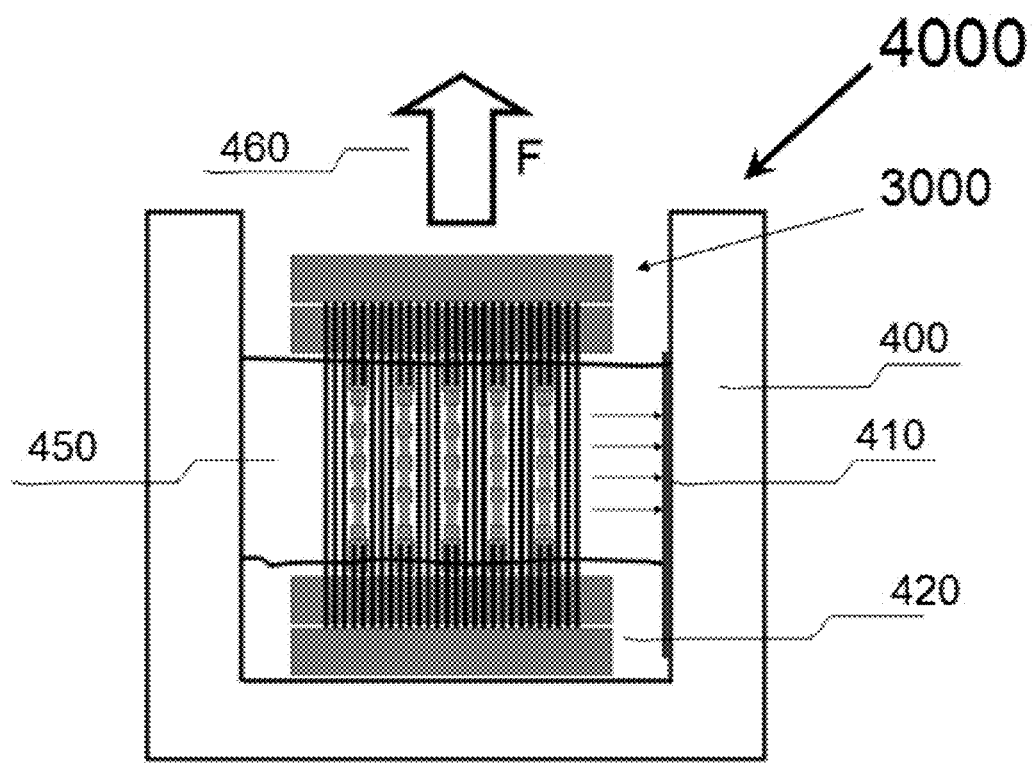
FIG. 5 is a schematic diagram for illustrating how to form an integrated ingot wherein a patterned array of metal wires and additive element strings 3000 (fixed at both ends by an arranging and fixing system of flat metal strips) are placed and positioned in a mold with a matrix material 450 filled of one embodiment of the present invention.

FIG. 3B is a schematic cross-sectional view along A2 to A2 plane in FIG. 5 for illustrating a set of flat strips for arranging a plurality of metal wires to a pattern in X direction. The two outer strips 310 are thick for fixing purpose by further combining with some other pieces, and the plurality of inner strips 312 may not be limited to the same thickness for defining different metal wire pitches in X-direction. The material for the flat strips needs to be rigid, such as tungsten or stainless steel.

Figure 3C:
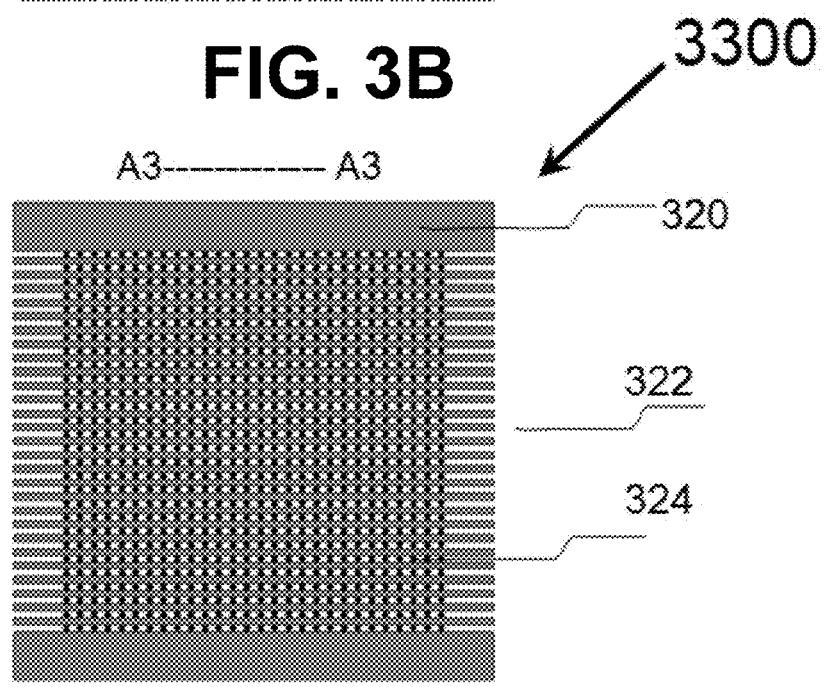
FIG. 3C is a schematic cross-sectional view along A3 to A3 plane in FIG. 3 for illustrating another set of flat strips for arranging the same plurality of metal wires as an array in X direction.

FIG. 3C is a schematic cross-sectional view along A3 to A3 plane in FIG. 5 for illustrating a set of flat strips for aligning a plurality of metal wires to a pattern in Y direction. The two outer strips 320 are thick for fixing purpose by further combining with some other pieces, and the plurality of inner strips 322 may not be limited to the same thickness for defining different metal wire pitches in Y-direction. The material for the flat strips needs to be rigid, such as tungsten or stainless steel.

Figure 4:
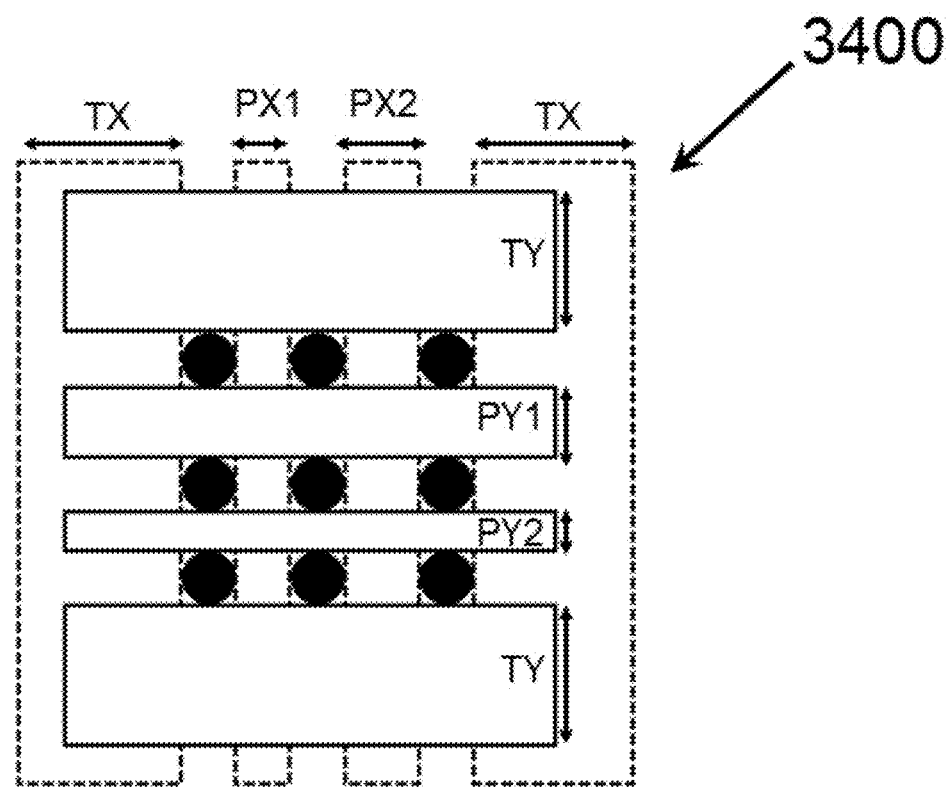
FIG. 4 is a schematic diagram for illustrating how to use a set of flat strips to form a patterned array of metal wires which may have different pitches in X or Y directions.

FIG. 4 is a schematic diagram for illustrating how to use a set of flat strips to form a patterned array of metal wires which may have different pitches in X or Y directions. The thicknesses TX and TY of outmost flat strips may be thick so as to form a fixture by combining with some other components. And the thicknesses PXi and PYi of inner flat strips determine the pitches among the metal wires in X and Y directions, respectively. The PXi and PYi are designable and some metal wires may be removed or replaced by guidance metal wires of other additive element strings so as to form a customized and patterned array of metal wires. The material for these flat strips needs to be rigid, and may be tungsten or stainless steel.

FIG. 5 is a schematic diagram for illustrating an example to form an integrated ingot by a molding system 4000, wherein the integrated assembly 3000 showed in FIG. 3 is placed and positioned in a mold 400 for forming an integrated ingot. The mold aligns in Z-direction or gravitational direction. A force F designated by number 460 is used to hang the integrated assembly 3000 in the mold 400 a little above the mold bottom without touching the mold bottom so that the patterned metal wires and additive element stings are in tension, keeping in straight. The number 420 designates a powder type of protective material covering the arranging and fixing assembly at the bottom end. The number 450 designate a matrix material filled and solidified in the mold. The melting point of any other materials involved in the molding system 4000 should be higher than the temperature for processing and solidifying the matrix material 450. For example, for a glass matrix material, tungsten may be a good selection of metal wires and the arranging and fixing assembly, and the embedded additive elements need to be selected and designed to survive during the processing temperature. For an epoxy matrix or molding compound matrix, copper wires may be a good selection. The number 410 designates a marked strip aligning with the layered structure in the ingot for sawing purpose when the matrix material is not transparent.

Figure 5A:
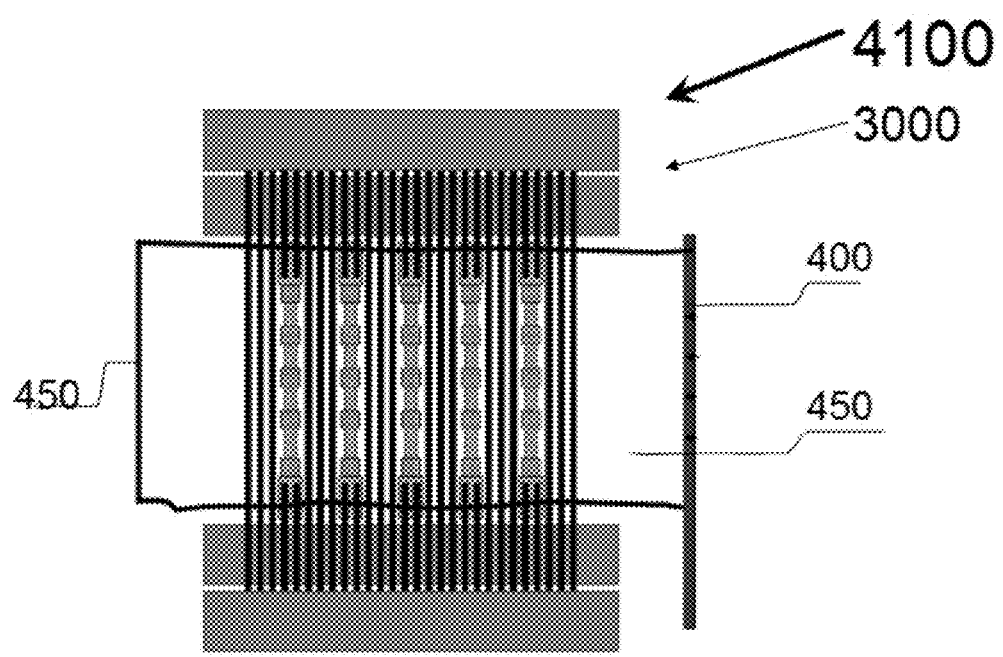
FIG. 5A is a schematic diagram of a primary ingot 4100 just ejected from the mold after the molding process showed in FIG. 5.

FIG. 5A illustrates an example of an integrated ingot 4100 formed by using a molding system and just ejected from the mold 400 in FIG. 5. The arranging and fixing assemblies on two ends of the raw integrated ingot 4100 are reusable, and the waste portions at two ends need to be removed. However, it is noted that methods for forming a solid dielectric material in the empty space among and around metal wires and other elements may not be limited to the method based on a molding system.

Figure 5B:
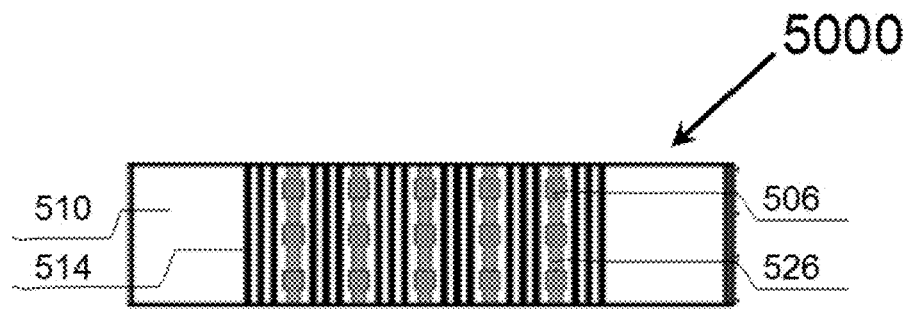
FIG. 5B is a schematic diagram of an integrated ingot after uninstalling the arranging and fixing system of flat strips and removing the waste portion of the primary ingot at its two ends of one embodiment of the present invention.
Figure 5C:
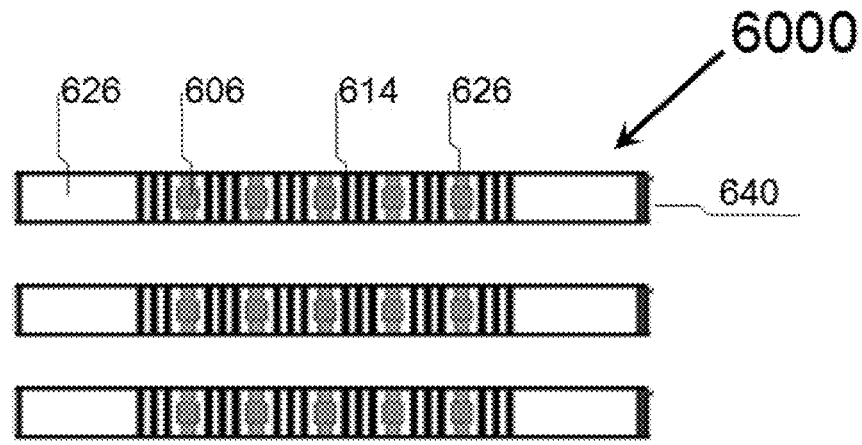
FIG. 5C is a schematic diagram illustrating substrates containing a patterned array of through substrate metal pillars and embedded additive elements formed after sawing the integrated ingot into slices.

FIG. 5B is a schematic diagram of an integrated ingot 5000, wherein the numbers 506, 526, 510 and 504 designate the additive elements, connection bodies, metal wires and matrix material, separately. The integrated ingot only includes three layers of additive elements, meaning it can produce three TSV substrates after sawing it, as showed in FIG. 5C. It is noted that the three layers of additive elements in Z direction and one substrate unit in X-Y plane is only for the illustrative purposes, and the cross-sectional shape of an integrated ingot according to the present invention may not be limited to a round shape, which can be customized according to the further processing of TSV substrates.

Figure 6:
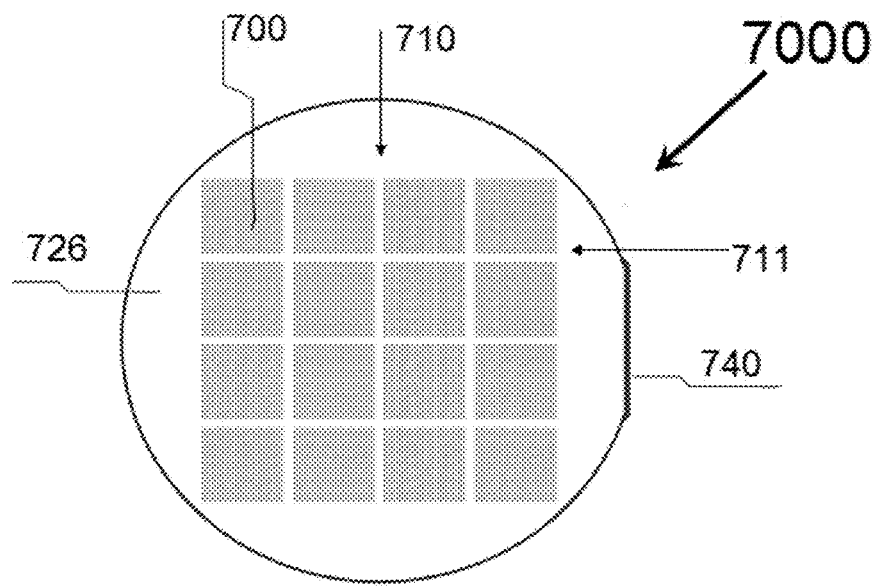
FIG. 6 is a schematic diagram for illustrating an example of a substrate containing a 4×4 substrate units 700 and sawing streets 710 and 711 among substrate units, the substrates may be produced in a batch way according to the present invention.

A practical integrated ingot may include a plurality of layers of additive elements and a plurality of substrate units in X-Y plane. FIG. 6 shows an example of TSV substrate 7000 that may be produced by the present method in a batch way, which contains a 4×4 array of TSV substrate units. The numbers 700, 726, 710 and 711 designate a TSV substrate unit, matrix material, sawing streets in Y direction and sawing streets in X direction. The number 740 designates the masked strip remained on the TSV substrate from the integrated ingot, which is optional.

Figure 6A:
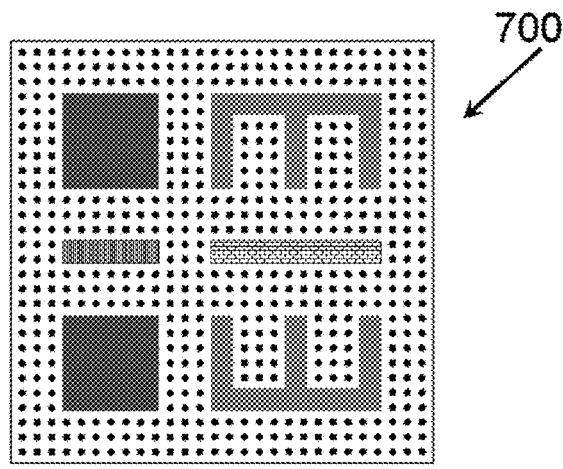
FIG. 6A is a schematic diagram for illustrating a substrate unit containing a patterned array of metal pillars and other embedded elements and through substrate pieces, the substrate unit may be produced in a batch way according to the present invention.

It is noted that the basic elements of the integrated ingot are the patterned array of metal wires, while the additive elements are optional, depending on the requirement in a specific application. When additive elements are not involved, it becomes relatively easier to produce an integrated ingot only containing a patterned array of metal wires. It is also noted that a metal or silicon column or a hollow tube may be introduced into the patterned array of metal wires by using the guidance wire method of one preferred embodiment. FIG. 6A shows an example of TSV substrate unit for illustrating various additive elements may be integrated into a TSV substrate unit and may be produced in a batch way according to the present invention.

Although the present invention is described in some details for illustrative purpose with reference to the embodiments and drawings, it is apparent that many other modifications and variations may be made without departing from the spirit and scope of the present invention.

What is claimed is:

1. A method for making an integrated ingot and further making substrates containing a patterned array of through substrate metal pillars, comprising,
   providing a plurality of metal wires;
   forming and fixing a patterned array of metal wires;
   placing and positioning the patterned array of metal wires into a mold;
   filling the empty space among and around the metal wires and inside the mold with a liquid or power type of dielectric matrix material;
   solidifying the dielectric material into an integrated ingot and ejecting the ingot from the mold;
   sawing the integrated ingot into slices from the direction normal to the patterned array of metal wires so as to form a plurality of substrates containing a patterned array of through substrate metal pillars.

2. A method for making an integrated ingot and further making substrates containing a patterned array of through substrate metal pillars and a plurality of through substrate pieces at desired locations, comprising,
   providing a plurality of metal wires;
   providing a plurality of columns, wherein the cross-sectional shapes of the columns form the shapes of the through substrate pieces;
   forming two or more guidance metal wires at each end of the two ends of each column;
   forming and fixing a patterned array of metal wires together with the guidance metal wires, wherein the guidance metal wires guide the columns to desired locations in the patterned array of metal wires;
   placing and positioning the patterned array of metal wires joined with a plurality of columns into a mold;
   filling the empty space among and around the metal wires and columns and inside the mold with a liquid or power type of dielectric matrix material;
   solidifying the dielectric material into an integrated ingot and ejecting the ingot from the mold;
   sawing the integrated ingot into slices from the direction normal to the patterned array of metal wires so as to form a plurality of substrates containing a patterned array of through substrate metal pillars and a plurality of through substrate pieces at desired locations.

3. A method for making an integrated ingot and further making substrates containing a patterned array of through substrate metal pillars and a plurality of embedded additive elements at desired locations, comprising,
   providing a plurality of metal wires;
   providing a plurality of additive elements;
   forming a plurality of additive element strings, wherein each end of the two ends of each additive element string includes two or more guidance metal wires;
   forming and fixing a patterned array of metal wires together with the guidance metal wires, wherein the guidance metal wires guide the additive element strings to desired locations in the patterned array of metal wires;
   placing and positioning the patterned array of metal wires joined with a plurality of additive element strings into a mold;

filling the empty space among and around the metal wires and additive element strings and inside the mold with a liquid or power type of dielectric matrix material;

solidifying the dielectric material into an integrated ingot and ejecting the ingot from the mold;

sawing the integrated ingot into slices from the direction normal to the patterned array of metal wires and through the middle locations between two adjacent additive elements along the direction of metal wires so as to form a plurality of substrates containing a patterned array of through substrate metal pillars and a plurality of embedded additive elements at desired locations.

4. A method for making an integrated ingot and further making substrates containing a patterned array of through substrate metal pillars, a plurality of through substrate pieces at desired locations and a plurality of embedded additive elements at desired locations, comprising, providing a plurality of metal wires;

providing a plurality of columns, wherein the cross-sectional shapes of the columns form the shapes of the through substrate pieces;

providing a plurality of additive elements;

forming two or more guidance metal wires at each end of the two ends of each column;

forming a plurality of additive element strings, wherein each end of the two ends of each additive element string includes two or more guidance metal wires;

forming and fixing a patterned array of metal wires together with the guidance metal wires, wherein the guidance metal wires guide the columns and the additive element strings to desired locations in the patterned array of metal wires;

placing and positioning the patterned array of metal wires joined with the plurality of columns and the plurality of additive element strings into a mold;

filling the empty space among and around the metal wires, columns and additive element strings and inside the mold with a liquid or power type dielectric matrix material;

solidifying the dielectric material into an integrated ingot and ejecting the ingot from the mold;

sawing the integrated ingot into slices from the direction normal to the patterned array of metal wires and through the middle locations between two adjacent additive elements along the direction of metal wires so as to form a plurality of substrates containing a patterned array of through substrate metal pillars, a plurality of through substrate pieces at desired locations and a plurality of embedded additive elements at desired locations.

5. A method for making an integrated ingot and further making substrates containing at least a patterned array of through substrate metal pillars, comprising the key steps, forming and fixing a patterned array of metal wires, wherein other additive elements may be integrated at desired location;

forming a solid dielectric material in the empty space among and around the patterned array of metal wires so as to form an integrated ingot;

sawing the integrated ingot into slices from the direction normal to the patterned array of metal wires so as to form a plurality of substrates containing at least a patterned array of through substrate metal pillars.

6. A guidance-metal-wire method for integrating a plurality of columns at desired locations in a patterned array of metal wires, comprising, forming a patterned array of metal wires by using an arranging and fixing system basically comprising a set of flat metal strips;

forming two or more guidance metal wires at each end of the two ends of each column, wherein the pitches among the guidance metal wires match with the pitches at the desired locations in the patterned array of metal wires;

combining the guidance metal wires at both ends of each column with the no patterned array of metal wires;

positioning the guidance metal wires at desired locations in the patterned array of metal wires;

fixing both ends of the patterned array of metal wires and guidance metal wires so as to integrate a plurality of columns at desired locations in a patterned array of metal wires.

7. A guidance-metal-wire method for integrating a plurality of discrete additive elements at desired locations in a patterned array of metal wires, comprising, forming a patterned array of metal wires by using an arranging and fixing system basically comprising a set of flat metal strips;

connecting a plurality of discrete additive element into a plurality of additive element strings;

forming two or more guidance metal wires at each end of the two ends of each additive element string, wherein the pitches among the guidance metal wires match with the pitches at the desired locations in the patterned array of metal wires;

combining the guidance metal wires at both ends of each additive element string with the patterned array of metal wires;

positioning the guidance metal wires at desired locations in the patterned array of metal wires;

fixing both ends of the patterned array of metal wires and guidance metal wires so as to integrate a plurality of discrete additive elements at desired locations in a patterned array of metal wires.

8. The method of claim 1, wherein the patterned array of metal wires are formed by using an arranging and fixing system basically comprising a set of flat metal strips.

9. The method of claim 2, wherein the columns may be integrated into the patterned array of metal wires and positioned at desired locations by two or more guidance metal wires formed at both ends of each column, and the patterned array of metal wires including the guidance metal wires may be formed and fixed by an arranging and fixing system basically comprising a set of flat metal strips.

10. The method of claim 3, wherein the additive element strings may be integrated into the patterned array of metal wires and positioned at desired locations by two or more guidance metal wires formed at both ends of each additive element string, and the patterned array of metal wires including the guidance metal wires may be formed and fixed by an arranging and fixing system basically comprising a set of flat metal strips.

11. The method of claim 4, wherein the columns and additive element strings may be integrated into the patterned array of metal wires and positioned at desired locations by two or more guidance metal wires at both ends of each additive element string and each column, and the patterned array of metal wires including the guidance metal wires may be formed and fixed by an arranging and fixing system basically comprising a set of flat metal strips.

12. An integrated ingot for making a substrate containing a patterned array of through substrate metal pillars, comprising, a dielectric matrix material;

a patterned array of metal wires embedded in the dielectric matrix material with desired pitches among metal wires;

a feature of sawing streets in the patterned array of metal wires, which divide the patterned array of metal wires into a plurality of metal wire units.

13. The integrated ingot of claim 12, further comprising,
a plurality of columns embedded in the dielectric matrix material and positioned at desired locations in the patterned array of metal wires for making a substrate containing a patterned array of through substrate metal pillars and a plurality of through substrate pieces at desired locations.

14. The integrated ingot of claim 12, further comprising,
a plurality of embedded additive element strings embedded in the dielectric matrix material and positioned at desired locations in the patterned array of metal wires, and a layered structure defined by the pitches between any two additive elements along the direction of additive element strings for making a substrate containing a patterned array of through substrate metal pillars and a plurality of embedded additive elements at desired locations.

15. The integrated ingot of claim 13, further comprising,
a plurality of embedded additive element strings embedded in the dielectric matrix material and positioned at desired locations in the patterned array of metal wires, and a layered structure defined by the pitches between any two additive elements along the direction of additive element strings for making a substrate containing a patterned array of through substrate metal pillars, a plurality of through substrate pieces at desired locations and a plurality of embedded additive elements at desired locations.

16. The integrated ingot of claim 12, wherein the metal wires may be tungsten wires or tungsten coated copper or aluminum wires and the dielectric matrix material may be glass, ceramic or silicon.

17. The integrated ingot of claim 12, wherein the metal wires may be copper or aluminum wires which may have one or more dielectric coatings and the dielectric matrix material may be polymer material, particle or fiber reinforced polymer material, or molding compound material.

18. The integrated ingot of claim 13, wherein the columns may not be identical, may consist of different materials and have different cross-sectional sizes and shapes.

19. The integrated ingot of claim 14, wherein the embedded additive elements may electrically connected with their adjacent metal wires.

20. The integrated ingot of claim 15, wherein the metal wires, columns and additive elements may form various combinations by selecting the material and cross-sectional size and shape of each columns and the type of each additive element so as to produce substrates containing a specifically designed configuration of through substrate metal pillars, through substrate pieces, embedded mechanical or electrical elements at desired locations.

\* \* \* \* \*